United States Patent
Nagatani et al.

(10) Patent No.: US 8,532,223 B2
(45) Date of Patent: Sep. 10, 2013

(54) POWER AMPLIFYING DEVICE AND POWER AMPLIFYING METHOD

(75) Inventors: Kazuo Nagatani, Kawasaki (JP); Hiroyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 581 days.

(21) Appl. No.: 12/720,269

(22) Filed: Mar. 9, 2010

(65) Prior Publication Data

US 2010/0237937 A1     Sep. 23, 2010

(30) Foreign Application Priority Data

Mar. 19, 2009     (JP) .................................. 2009-68422

(51) Int. Cl.
*H04K 1/02*     (2006.01)
*H04L 25/03*     (2006.01)
*H04L 25/49*     (2006.01)

(52) U.S. Cl.
USPC ......................................................... 375/297

(58) Field of Classification Search
None
See application file for complete search history.

(56) References Cited

U.S. PATENT DOCUMENTS

| 6,646,501 | B1 | 11/2003 | Wessel |
| 7,135,918 | B1 | 11/2006 | Outaleb et al. |
| 7,602,244 | B1 | 10/2009 | Holms et al. |
| 8,126,411 | B2 * | 2/2012 | Kim .............................. 455/126 |
| 2005/0079835 | A1 * | 4/2005 | Takabayashi et al. ..... 455/127.1 |
| 2007/0229180 | A1 | 10/2007 | Shimizu et al. |
| 2008/0026706 | A1 | 1/2008 | Shimizu et al. |
| 2008/0139140 | A1 | 6/2008 | Matero et al. |

FOREIGN PATENT DOCUMENTS

| JP | 2005-269440 | 9/2005 |
| JP | 2006-197537 | 7/2006 |
| JP | 2006-333450 | 12/2006 |
| JP | 2008-131186 | 6/2008 |
| WO | 2005/027342 | 3/2005 |
| WO | WO 2005027342 A1 * | 3/2005 |

OTHER PUBLICATIONS

European Patent Office "Office Action" issued for corresponding European Patent Application No. 10 155 084.6, dated Apr. 19, 2004.
European Patent Office "Office Action" issued for corresponding European Patent Application No. 10 155 084.6, dated Apr. 19, 2011.

(Continued)

*Primary Examiner* — Chieh M Fan
*Assistant Examiner* — Wednel Cadeau
(74) *Attorney, Agent, or Firm* — Myers Wolin, LLC

(57) ABSTRACT

A power amplifying device includes an amplifier that amplifies a signal which is input in accordance with a voltage signal which is supplied to the amplifier, a voltage control section that controls the voltage signal in accordance with a transmission signal, a distortion compensating section that executes a distortion compensating process on the transmission signal by giving a value indicative of a reverse characteristic of the amplifier to the transmission signal in advance and inputs an output signal obtained by executing the distortion compensating process into the amplifier, an amplitude detecting section that detects an amplitude of the transmission signal, and a timing adjusting section that adjusts timings of the output signal and the voltage signal so that a value relating to the distortion compensating process meets a given condition when a detected value of the amplitude of the transmission signal is less than a given value.

8 Claims, 11 Drawing Sheets

(56) References Cited

OTHER PUBLICATIONS

Extended European Search Report with written opinion issued for corresponding European Patent Application No. 10155084, mailed Jul. 21, 2010.

Jinseong Jeong et al.;"Wideband Envelope Tracking Power Amplifiers With Reduced Bandwidth Power Supply Waveforms and Adaptive Digital Predistortion Techniques"; IEEE Transactions on Microwave Theory and Techniques Vo. 57. 12., Dec. 2009. [Ref.: EESR dated Jul. 21, 2010].

Notification of Reason for Refusal issued for corresponding Japanese Application No. 2009-068422 dispatched Jul. 31, 2012 with partial English translation.

* cited by examiner

US 8,532,223 B2

POWER AMPLIFYING DEVICE AND POWER AMPLIFYING METHOD

CROSS-REFERENCE TO RELATED APPLICATION

This application is based upon and claims the benefit of priority of the prior Japanese Patent Application No. 2009-68422, filed on Mar. 19, 2009, the entire contents of which are incorporated herein by reference.

FIELD

The present invention relates to a power amplifying device and a power amplifying method of performing voltage control and distortion compensation on signals supplied to an amplifier.

BACKGROUND

A high power efficiency is desired for a power amplifying device used in radio communication. However, the linearity and efficiency of the power amplifying device are characteristics which are incompatible with each other. Accordingly, various distortion compensating methods have been proposed so far in order to make them compatible with each other.

FIG. 1 is a configurational diagram illustrating an example of a conventional power amplifying device. In the example illustrated in FIG. 1, a transmission signal (I, Q) is supplied to a terminal 1. The transmission signal is then supplied to a voltage control section 2 and a distortion compensating section 3. The voltage control section 2 obtains the amplitude of the transmission signal (I, Q) and generates a voltage signal which is based on this amplitude. The voltage signal is then supplied to a power source terminal of a voltage control amplifier 5 via a delay section 4.

The distortion compensating section 3 has a pre-distortion signal generating section 6 and an adaptive control section 7. The pre-distortion signal generating section 6 generates a pre-distortion signal using, for example, a series type distortion compensation system. The pre-distortion signal is then supplied to an orthogonal modulator 9 via a delay section 8 and is orthogonally modulated. The orthogonally modulated signal of a radio frequency output from the orthogonal modulator 9 is supplied to an input terminal of the voltage control amplifier 5.

The voltage control amplifier 5 performs power amplification on the orthogonally modulated signal by changing its amplification characteristic in accordance with a voltage signal supplied to the power source terminal. An output signal from the voltage control amplifier 5 is output from a terminal 11 via a directional coupler 10. Part of the orthogonally modulated signal is taken out of the directional coupler 10 and is orthogonally demodulated using an orthogonal demodulator 12. The obtained demodulated signal (I, Q) is supplied to the coefficient updating section 7 via a filter 13.

The adaptive control section 7 has a pre-distortion signal generating section 14 of the same configuration as the pre-distortion signal generating section 6, a subtractor 15, and a coefficient updating section 16.

The pre-distortion signal generating section 14 generates a pre-distortion signal from the demodulated signal and supplies the generated pre-distortion signal to the subtracter 15, and supplies the demodulated signal to the coefficient updating section 16. The subtractor 15 subtracts the pre-distortion signal which is generated from the demodulated signal and output from the pre-distortion signal generating section 14 from the pre-distortion signal which is generated from the transmission signal and output from the pre-distortion signal generating section 6 to obtain a difference between these signals and supplies the difference to the coefficient updating section 16. The coefficient updating section 6 calculates distortion compensation coefficients and supplies the calculated distortion compensation coefficients respectively to the pre-distortion signal generating sections 6 and 14 as new distortion compensation coefficients.

A technique of storing delay amount information for information on amplitude value and transmission level of an amplitude signal in the form of table data using a polar coordinates modulation system and executing delay adjustment using the information on amplitude signal and transmission level of the amplitude signal as a reference signal is proposed (see, for example, Japanese Laid-open Patent Publication No. 2006-333450).

In addition, a technique of improving the responsibility in amplitude of an output signal from an amplifier to a change in control voltage by executing amplitude adjustment on amplitude information which has been subjected to amplitude correction in a steady state using the polar coordinates modulation system is also proposed (see, for example, Japanese Laid-open Patent Publication No. 2006-197537).

In the voltage control amplifier 5 that changes the voltage signal supplied to the power source terminal in accordance with the transmission signal, timings of the voltage signal and the transmission signal supplied to the voltage control amplifier 5 are adjusted using the delay section 8. In general, the timings are adjusted upon adjustment carried out in a factory and after the timings have been adjusted in the factory, a delay amount of the delay section 8 is fixed and is not variably controlled in operation.

Therefore, such a problem is caused that in the case that a change occurs in path length characteristic between a path ranging from the voltage control section 2 to the delay section 4 and a path ranging from the distortion compensating section 3, through the delay section 8, to the orthogonal modulator 9, influenced by temperature change and aged deterioration of respective electronic components such as the voltage control section 2, the delay section 4, the distortion compensating section 3, the delay section 8 and the orthogonal modulator 9 making up the power amplifying device, a lag in timing is generated between the voltage signal and the transmission signal to decrease the transmission characteristic.

SUMMARY

According to an aspect of the embodiments discussed herein, a power amplifying device includes an amplifier that amplifies a signal which is input in accordance with a voltage signal which is supplied to the amplifier, a voltage control section that controls the voltage signal in accordance with a transmission signal, a distortion compensating section that executes a distortion compensating process on the transmission signal by giving a value indicative of a reverse characteristic of an input-to-output characteristic of the amplifier to the transmission signal in advance and inputs an output signal obtained by executing the distortion compensating process into the amplifier, an amplitude detecting section that detects an amplitude of the transmission signal, and a timing adjusting section that adjusts timings of the output signal and the voltage signal so that a value relating to the distortion compensating process executed on the transmission signal meets a given condition when a detected value of the amplitude of the transmission signal is less than a given value.

It is to be understood that both the foregoing general description and the following detailed description are exemplary and explanatory and are not restrictive of the embodiments, as claimed.

DESCRIPTION OF EMBODIMENTS

Next, embodiments will be described with reference to the accompanying drawings.

First Embodiment

Figure 1:
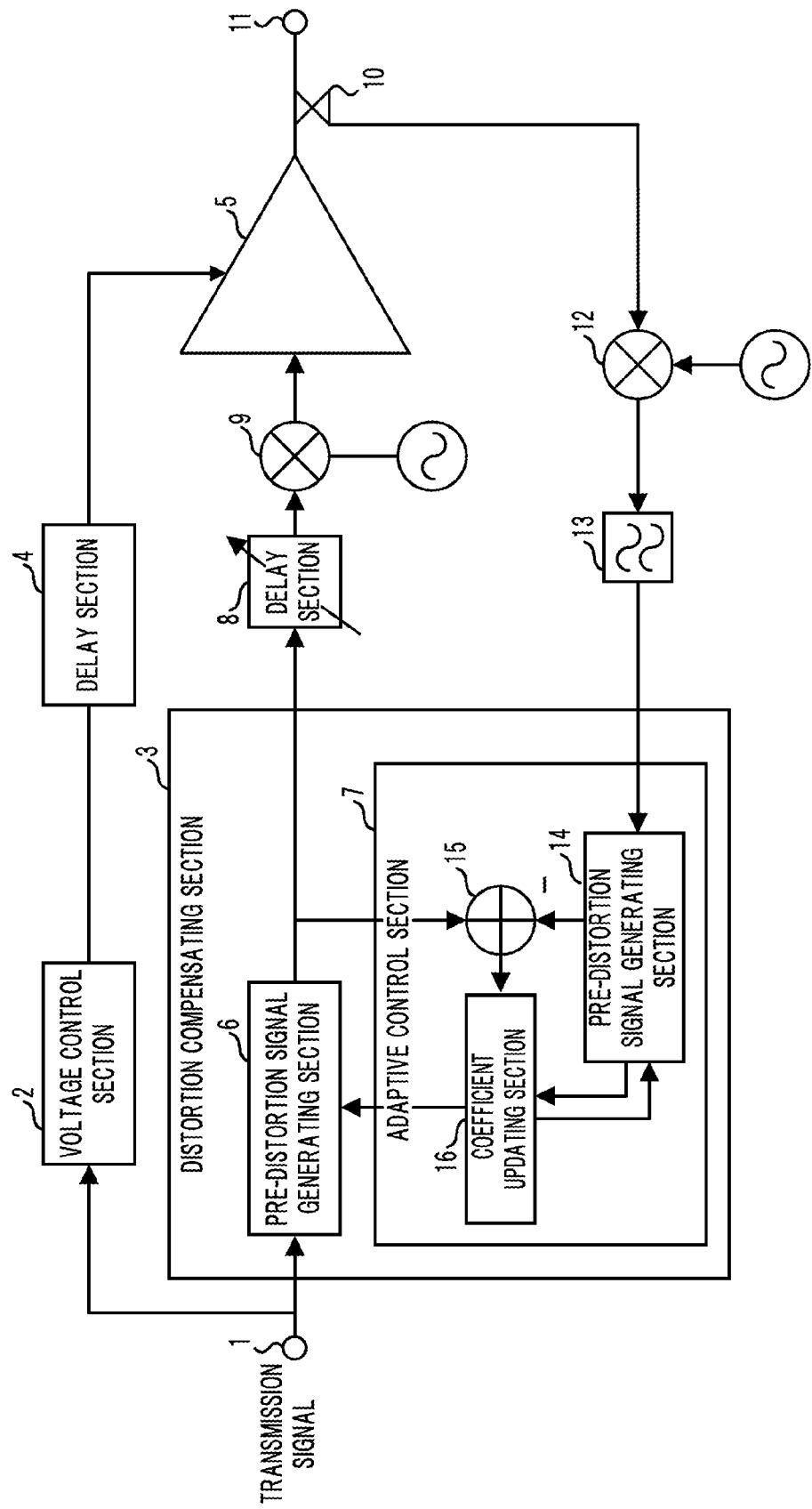
FIG. 1 is a configurational diagram illustrating an example of a conventional power amplifying device.
Figure 2:
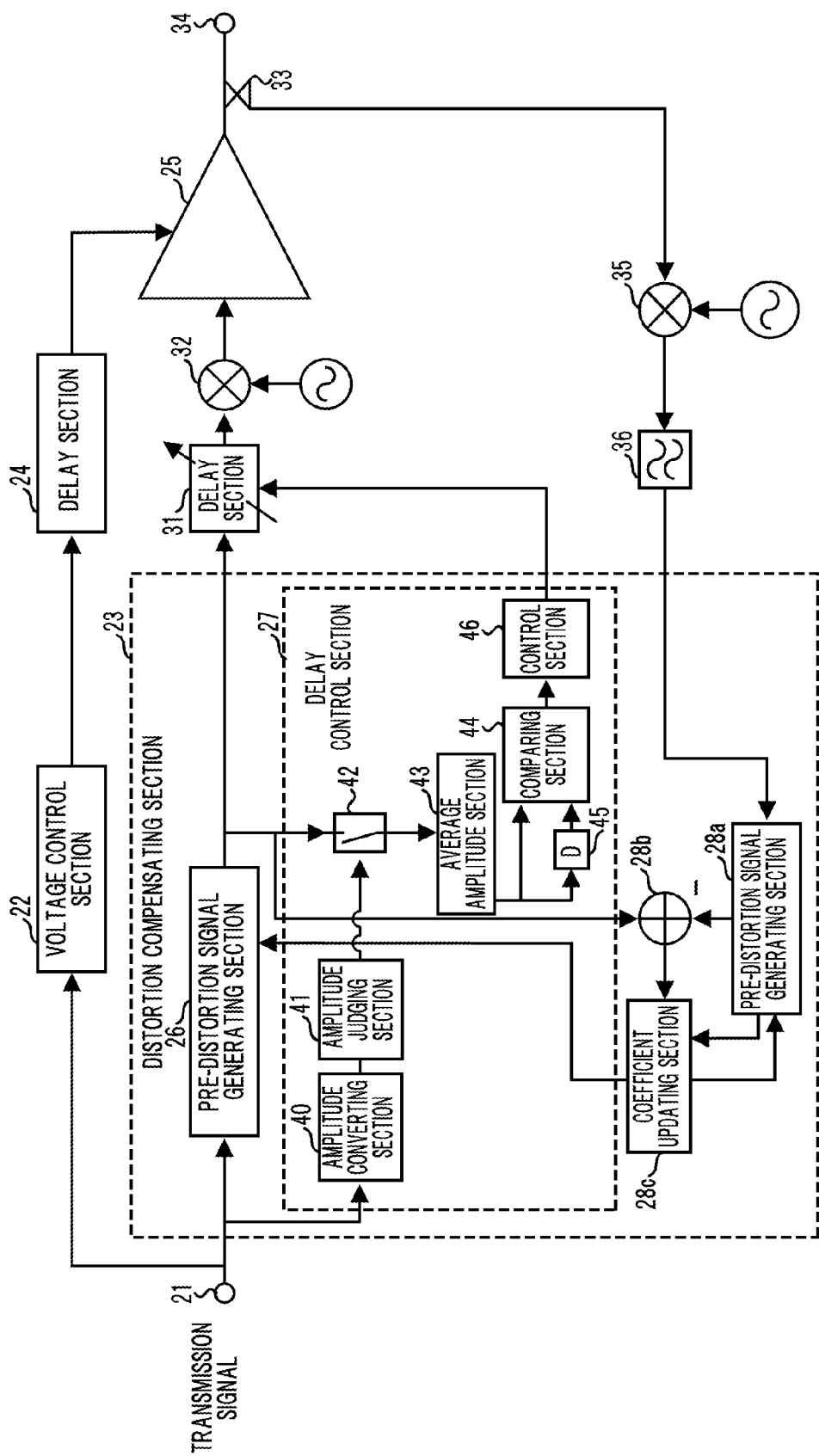
FIG. 2 is a diagram illustrating a configuration of a first embodiment of a power amplifying device.

FIG. 2 is a diagram illustrating a configuration of a first embodiment of a power amplifying device. In FIG. 2, a transmission signal (I, Q) is supplied to a terminal 21. The transmission signal is then supplied to a voltage control section 22 and a distortion compensating section 23. The voltage control section 22 obtains the amplitude $[(I^2+Q^2)^{1/2}]$ of the transmission signal (I, Q) and substitutes the obtained amplitude into a function F to generate a voltage signal which is based on the amplitude. In the example illustrated in the drawing, the function F is a function with which a voltage signal is set to a constant value when the amplitude value is less than, for example, a given value α and the voltage signal is set to a value proportional to the amplitude value when the amplitude value is more than the given value α (α corresponds to, for example, fractions of a maximum amplitude of the transmission signal). The voltage signal is supplied to a power source terminal of a voltage control amplifier 25 via a delay section 24.

The distortion compensating section 23 has a pre-distortion signal generating section 26, a delay control section 27, a pre-distortion signal generating section 28a, a subtractor 28b, and a coefficient updating section 28c. The pre-distortion signal generating section 26 generates a pre-distortion signal using, for example, a series type distortion compensation system. As the pre-distortion signal generating section 26, a pre-distortion signal generating section of a look-up table system may be also employed.

Figure 3:
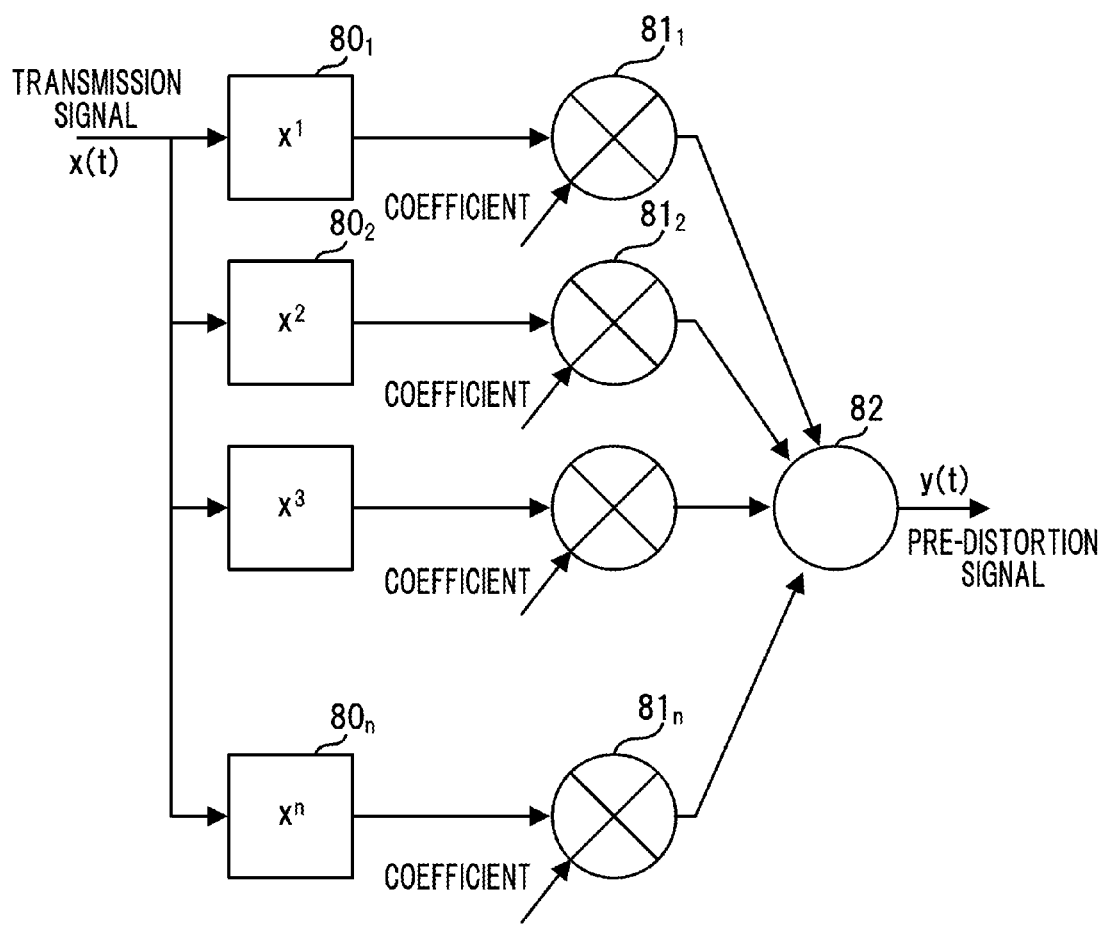
FIG. 3 is a diagram illustrating a configuration of a pre-distortion signal generating section of a series type distortion compensation system.

The pre-distortion signal generating section of the series type distortion compensation system has raising parts $80_1$ to $80_n$ that raise a transmission signal x(t) to 1st, 2nd, 3rd, ... and n-th powers, multiplying parts $81_1$ to $81_n$ that multiply outputs from the raising sections $80_1$ to $80_n$ and coefficients, and an adding part 82 that sums up outputs from the multiplying parts $81_1$ to $81_n$. A pre-distortion signal y(n) expressed by an equation illustrated at the bottom of FIG. 3 is generated using the pre-distortion signal generating section 26 configured as mentioned above and is output from the adding part 82.

As the pre-distortion signal generating section 26, a pre-distortion signal generating section based on a look-up table system, for example, may also be used in which an address is generated from the amplitude of the transmission signal and an increment of the amplitude to gain access to a distortion compensation coefficient table using the address, distortion compensation coefficients may be read out of the distortion compensation coefficient table. Then, the transmission signal and the distortion compensation coefficients are complex-multiplied to generate a pre-distortion signal to which a reverse characteristic of the distortion characteristic of the voltage control amplifier 25 is given.

The pre-distortion signal is supplied to an orthogonal modulator 32 via a delay section 31 to be orthogonally modulated. An orthogonally modulated signal of a radio frequency output from the orthogonal modulator 32 is supplied to an input terminal of the voltage control amplifier 25.

The voltage control amplifier 25 changes the amplification characteristic of the orthogonally modulated signal in accordance with a voltage signal supplied to the power source terminal to perform power amplification on the orthogonally modulated signal. An output signal from the voltage control amplifier 25 is output from a terminal 34 via a directional coupler 33. Part of the orthogonally modulated signal is taken out of the directional coupler 33 and is orthogonally demodulated using an orthogonal demodulator 35. The obtained demodulated signal (I, Q) is supplied to the pre-distortion signal generating section 28a via a filter 36.

The pre-distortion signal generating section 28a has the same configuration as the pre-distortion signal generating section 26, generates a pre-distortion signal from the demodulated signal, supplies the generated pre-distortion signal to the subtractor 28b, and supplies the demodulated signal to the coefficient updating section 28c. The subtractor 28b subtracts the pre-distortion signal which is generated from the demodulated signal and output from the pre-distortion signal generating section 28a from the pre-distortion signal which is generated from the transmission signal and output from the pre-distortion signal generating section 26 to obtain a difference between these signals and supplies the obtained difference to the coefficient updating section 28c. The coefficient updating section 28c calculates distortion compensation coefficients $h_1$ to $h_n$ using equations (1) and supplies the calculated distortion compensation coefficients $h_1$ to $h_n$ to the pre-distortion signal generating sections 26 and 28a as new distortion compensation coefficients.

Next, the equations of generating the distortion compensation coefficients $h_1$ to $h_n$ will be given. In the equations, x(t) is a transmission signal, r(t) is a modulated signal, e(t) is a difference, μ1 to μn are coefficients, and n is a degree.

$$h_1(t) = h_1(t-1) + \mu_1 e(t) r(t)$$
$$h_2(t) = h_2(t-1) + \mu_2 e(t) |r(t)| r(t)$$
$$\ldots$$
$$h_n(t) = h_n(t-1) + \mu_n e(t) |r(t)|^{(n-1)} r(t)$$

(1)

Next, the delay control section 27 will be described. An amplitude converting section 40 in the delay control section 27 obtains the value of the amplitude $[(I^2+Q^2)^{1/2}]$ of the transmission signal supplied from the terminal 21 and supplies the obtained amplitude value to an amplitude judging section 41. The amplitude judging section 41 judges whether the amplitude value is less than a given value β and is more than a given value α(<β). In the example, the given value β is sufficiently smaller than, for example, the value of a maximum amplitude of the transmission signal, such as, for example, about ⅘ the maximum amplitude of the transmission signal. The amplitude judging section 41 generates and supplies a switch-on signal to a switch 42 when the amplitude value is less than the given value β and more than the given value α. The reason why the switch is set to be turned on when a transmission signal part of the amplitude is less than the given value β lies in that the amplitude of the pre-distortion signal changes when the transmission signal part of the amplitude is less than the given value β, influenced by a lag in timing between the transmission signal in the voltage control amplifier 25 and the pre-distortion signal.

The pre-distortion signal is supplied to the switch 42 from the pre-distortion signal generating section 26 and the switch 42 is turned on when the switch-on signal is being supplied from the amplitude judging section 41. The switch 42 is turned on to supply the pre-distortion signal to an average amplitude section 43. The average amplitude section 43 obtains the amplitudes of the pre-distortion signal which is supplied when the switch 42 is turned on and also obtains the average amplitude value of the pre-distortion signal.

The average amplitude value of the pre-distortion signal obtained using the average amplitude section 43 is directly supplied to a comparing section 44 and is also supplied to the comparing section 44 via a delay section 45 where the average amplitude value of the pre-distortion signal is delayed by a given time D corresponding to the time to update the distortion compensation coefficient by being subjected to feedback control using the delay section 45. The comparing section 44 compares the undelayed average amplitude value with the delayed average amplitude and supplies a result of the comparison to a control section 46. The control section 46 variably adjusts the delay time of the delay section 31 in accordance with the result of comparison. As an alternative, the control section 46 may be configured to variably adjust the delay time of the delay section 24 in place of the delay section 31.

(Pre-Distortion Signal Waveform)

Figure 4A:
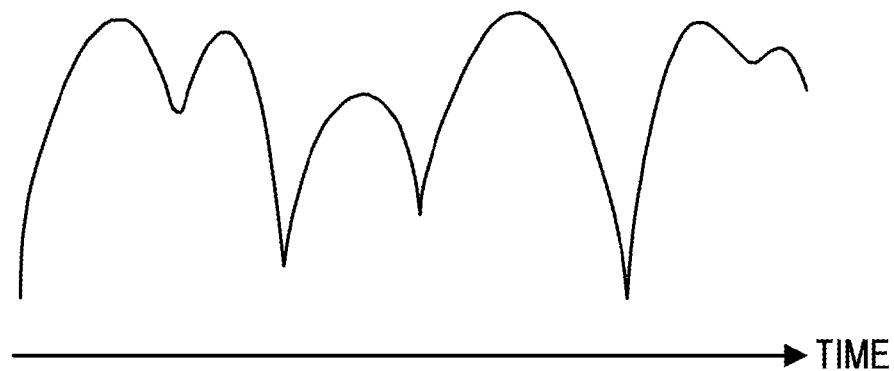
FIGS. 4A-4C are diagrams illustrating a pre-distortion signal waveform.
Figure 4B:
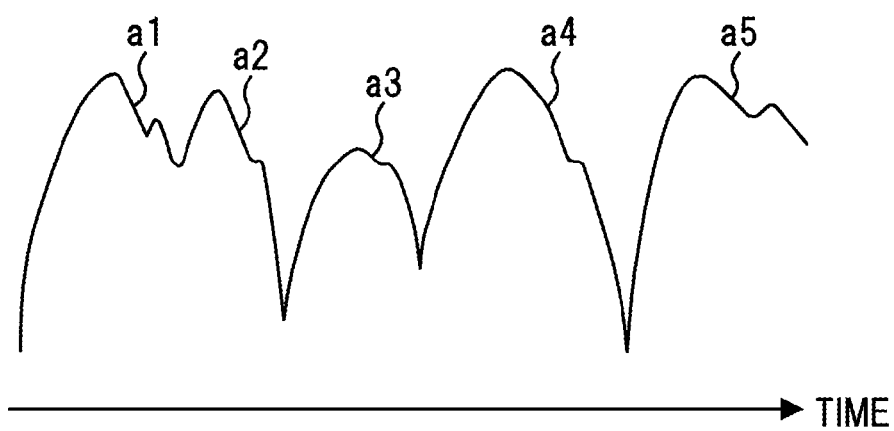

A situation in which the timing of the transmission signal input into the voltage control amplifier 25 is different from the timing of the voltage signal input into the voltage control amplifier 25 will be discussed. In the above mentioned situation, since a period for which the voltage of the voltage signal is insufficient occurs, the amplitude of the output signal from the voltage control amplifier 25 becomes smaller than a desired amplitude relative to the transmission signal (which is not subjected to pre-distortion) of the amplitude waveform illustrated in FIG. 4A, and hence notches a1 to a5 as illustrated in FIG. 4B or notches b1 to b5 as illustrated in FIG. 4C are formed in the waveform.

Figure 5A:
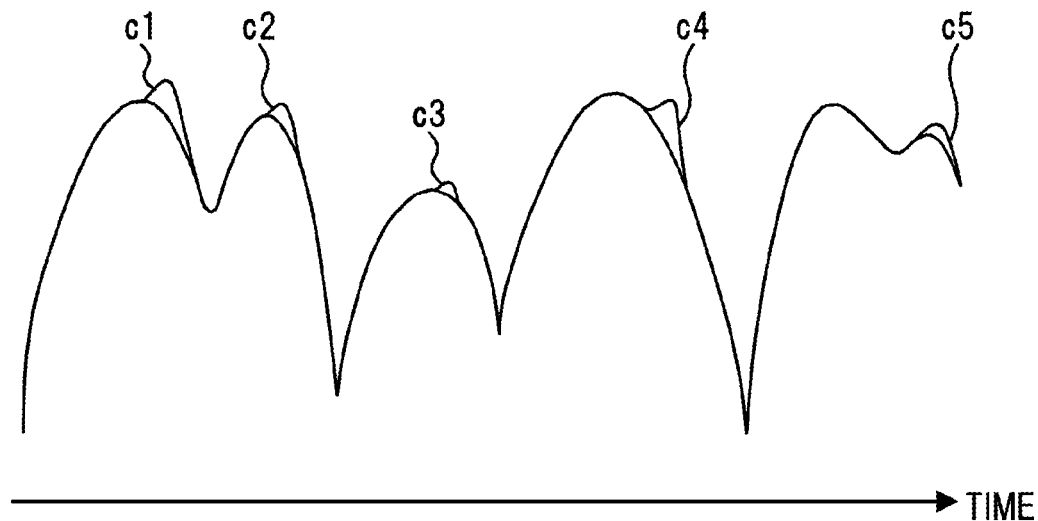
FIGS. 5A and 5B are diagrams illustrating a pre-distortion signal waveform.

If the distortion compensation coefficient used in the pre-distortion signal generating section 26 is updated using the coefficient updating section 28 in a state that a signal which is output from the voltage control amplifier 25 having the amplitude smaller than the desired amplitude is fed back, the distortion compensation coefficients corresponding to the notches will be increased so as to compensate for the reductions in amplitude. Accordingly, the variance value of the distortion compensation coefficients will be increased. That is, protrusions c1 to c5 illustrated in FIG. 5A are generated in the waveform of the pre-distortion signal corresponding to the notches a1 to a5 illustrated in FIG. 4B in the waveform of the output signal and hence the average value of amplitudes of parts of the pre-distortion signal which are smaller than the maximum amplitude is increased.

Figure 4C:
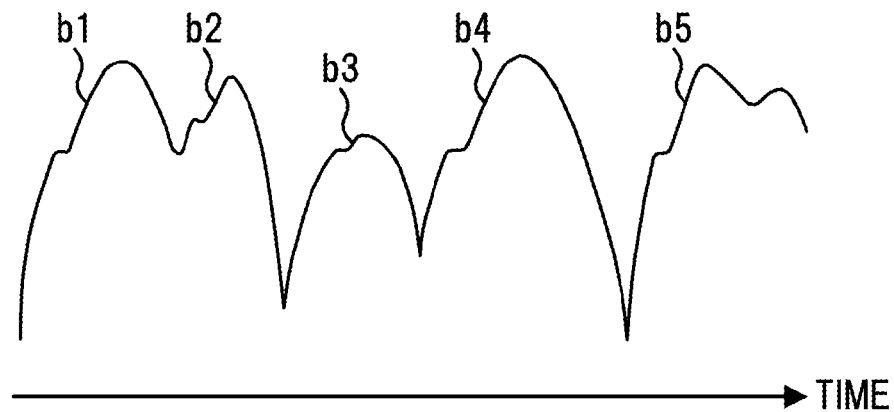
Figure 5B:
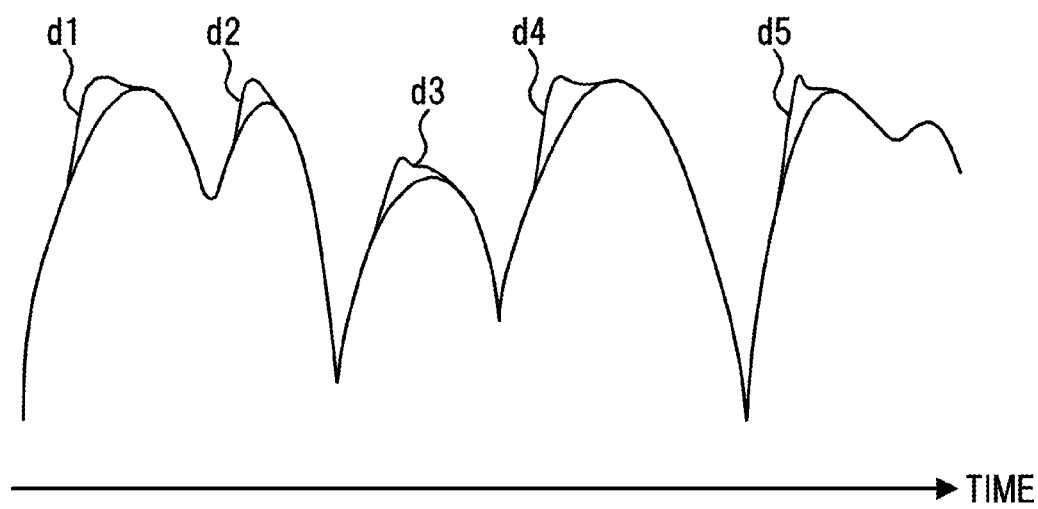

In addition, protrusions d1 to d5 illustrated in FIG. 5B are generated in the waveform of the pre-distortion signal corresponding to the notches b1 to b5 illustrated in FIG. 4C in the waveform of the output signal and hence the average value of amplitudes of parts of the pre-distortion signal which are smaller than the maximum amplitude is increased.

Therefore, it may be possible to bring the timing of the transmission signal input into the voltage control amplifier 25 into coincidence with the timing of the voltage signal input into the voltage control amplifier 25 by variably adjusting the delay time of the delay section 31 so that the average amplitude value of the amplitudes of the parts of the pre-distortion signal which are smaller than the maximum amplitude is reduced after the distortion compensation coefficient has been updated.

(Flowchart of Delay Adjusting Process)

Figure 6:
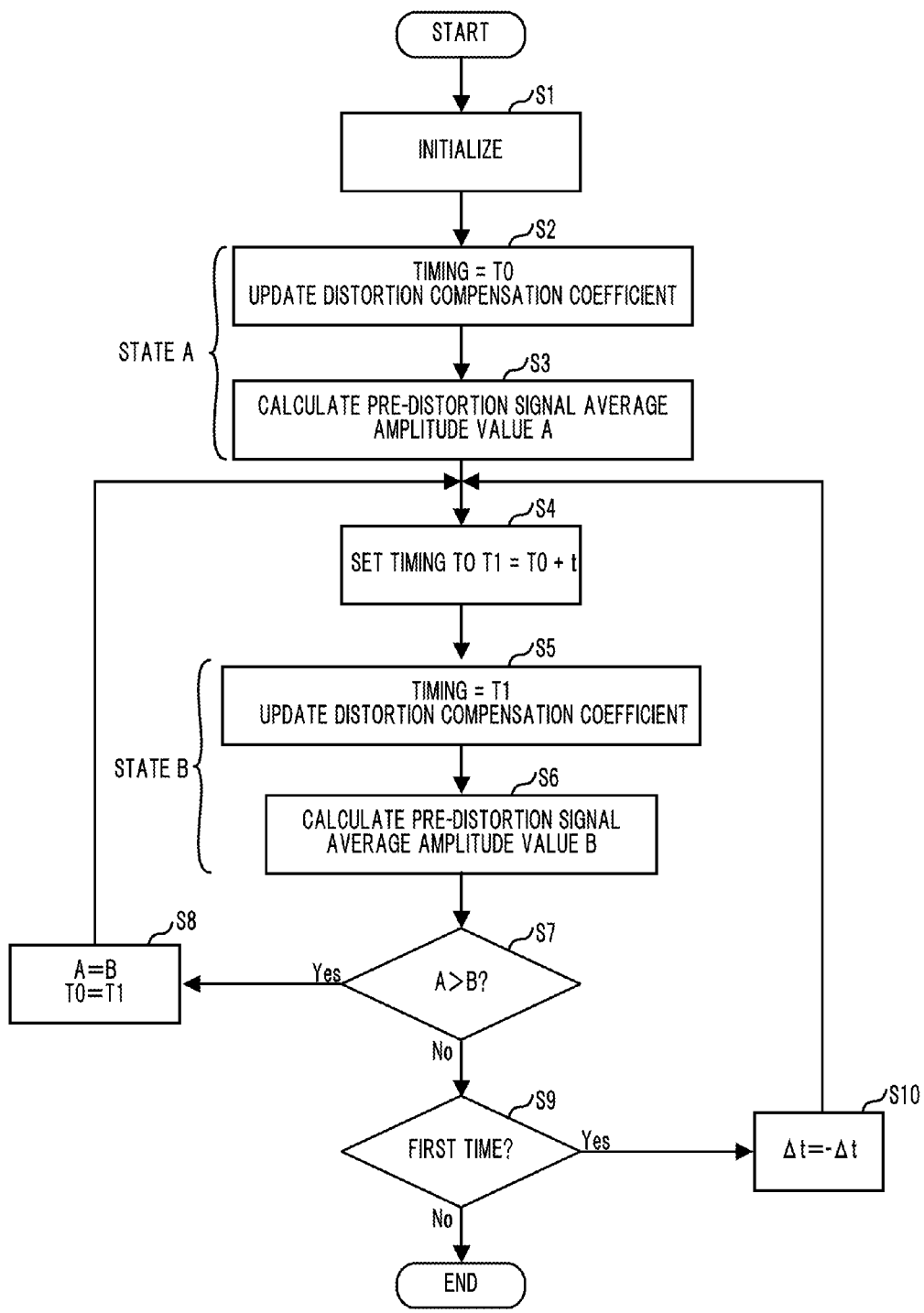
FIG. 6 is a flowchart of an embodiment of a delay adjusting process executed using a power amplifying device.

FIG. 6 illustrates a flowchart of one embodiment of a delay adjusting process executed using the power amplifying device. In FIG. 6, initialization is executed at S1. Next, at S2, the control section 46 sets a delay time (timing) of the delay section 31 to T0 which is a default value (state A). At S2, the coefficient updating section 28c generates distortion compensation coefficients in the state A to update the distortion compensation coefficients of the pre-distortion signal generating sections 26 and 28a. The average amplitude section 43 obtains an average amplitude value A at S3.

At S4, the control section 46 sets the delay time (timing) of the delay section 31 to a value T1 which is prolonged from the value T0 by a short time Δt (state B). At S5, the coefficient updating section 28c generates distortion compensation coefficients in the state B to update the distortion compensation coefficients of the pre-distortion signal generating sections 26 and 28a. At S6, the average amplitude section 43 obtains an average amplitude value B.

Then, at S7, the comparing section 44 compares the average amplitude value A with the average amplitude value B. A>B indicates that the average amplitude value is reduced and hence the timing of the transmission signal is brought into coincidence with the timing of the voltage signal, so that at S8, the control section 46 replaces the average amplitude value A with the average amplitude value B and replaces T0 with T1 and then returns to S4 to repeatedly execute the processes from S4 to S7.

On the other hand, when at S7, A≦B, whether or not execution of the process at S9 is the first-time execution is judged. When it is judged to be the first-time execution, at S10, the sign of the short time Δt is changed to negative and the process returns to S4 to repeatedly execute the processes at steps S4 to S7. That is, at first, if the delay time (timing) is prolonged from T0 each time by the short time Δt, then the delay time (timing) will be shortened each time by the short time Δt by executing the process at S10. When the execution of the process at S9 is judged to be a second-time execution or succeeding executions, execution of the process is terminated.

Execution of the delay adjusting process allows the generation of distortion compensation coefficients with which the average amplitude value is minimized. Accordingly, a lag in timing between the voltage signal and the transmission signal in the voltage control amplifier may be reduced regardless of temperature change and aged deterioration of the electronic components making up the power amplifying device.

Second Embodiment

Figure 7:
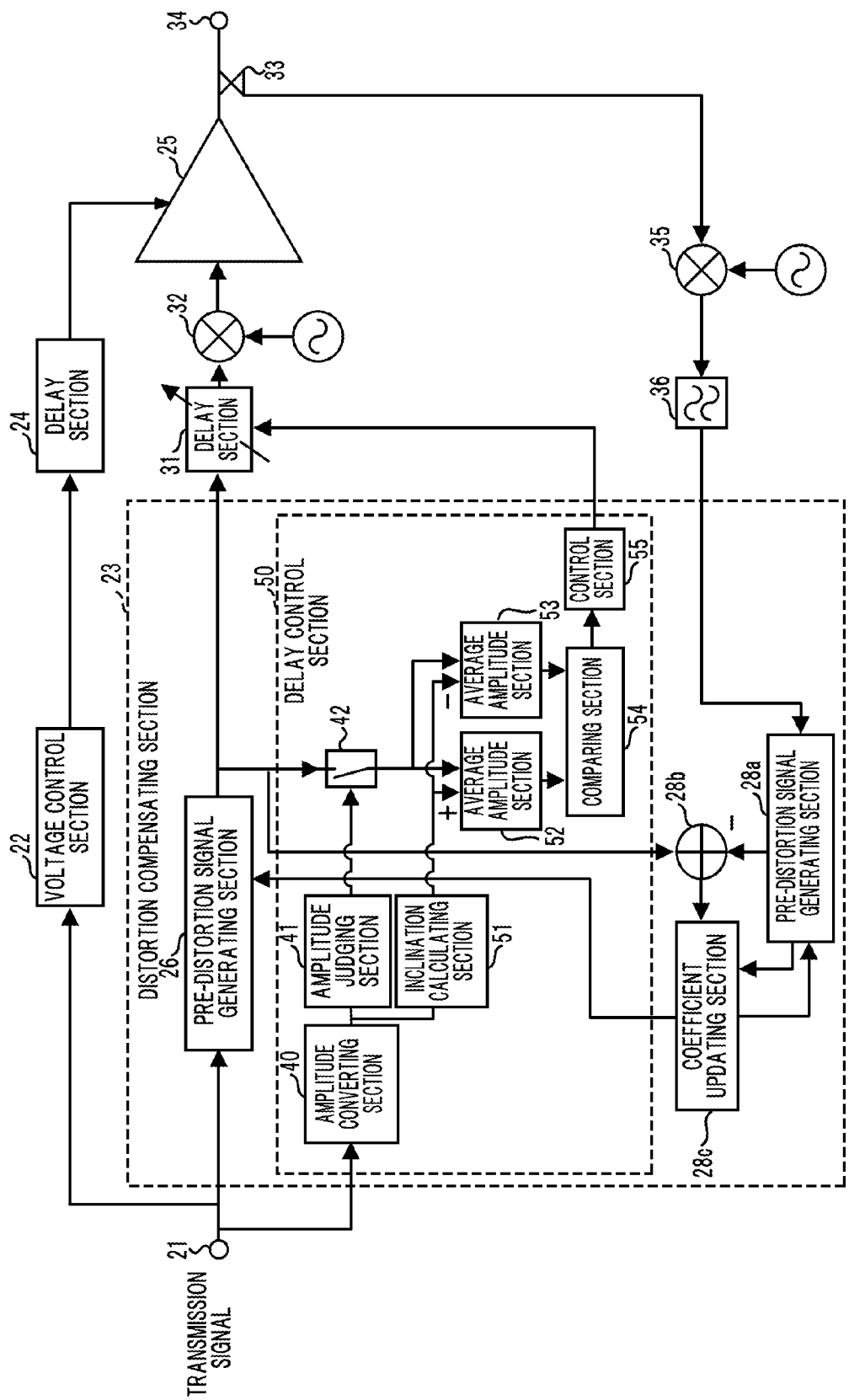
FIG. 7 is a diagram illustrating a configuration of a second embodiment of the power amplifying device.

FIG. 7 is a diagram illustrating a configuration of a second embodiment of the power amplifying device. In FIG. 7, the same numerals are assigned to the same parts as those in FIG. 2.

In FIG. 7, the transmission signal (I, Q) is supplied to the terminal 21. The transmission signal is then supplied to the voltage control section 22 and the distortion compensating section 23. The voltage control section 22 obtains the amplitude $[(I^2+Q^2)^{1/2}]$ of the transmission signal (I, Q) and substitutes the obtained amplitude into the function F to generate the voltage signal which is based on the amplitude. In the example illustrated in the drawing, the function F is the function with which the voltage signal is set to the constant value when the amplitude value is less than, for example, the given value $\alpha$ and the voltage signal is set to the value proportional to the amplitude value when the amplitude value is more than the given value $\alpha$ ($\alpha$ corresponds to, for example, fractions of the maximum amplitude of the transmission signal). The voltage signal is supplied to the power source terminal of the voltage control amplifier 25 via the delay section 24.

The distortion compensating section 23 includes the pre-distortion signal generating section 26, a delay control section 50, the pre-distortion signal generating section 28a, the subtractor 28b, and the coefficient updating section 28c. The pre-distortion signal generating section 26 generates a pre-distortion signal using, for example, a series type distortion compensation system. As the pre-distortion signal generating section 26, a pre-distortion signal generating section based on a look-up table system may also be employed.

The pre-distortion signal is supplied to the orthogonal modulator 32 via the delay section 31 to be orthogonally modulated. The orthogonally modulated signal of the radio frequency output from the orthogonal modulator 32 is supplied to the input terminal of the voltage control amplifier 25.

The voltage control amplifier 25 changes the amplification characteristic of the orthogonally modulated signal in accordance with the voltage signal supplied to the power source terminal to perform power amplification on the orthogonally modulated signal. The output signal from the voltage control amplifier 25 is output from the terminal 34 via the directional coupler 33. Part of the orthogonally modulated signal is taken out of the directional coupler 33 and is orthogonally demodulated using the orthogonal demodulator 35. The obtained demodulated signal (I, Q) is supplied to the pre-distortion signal generating section 28a via the filter 36.

The pre-distortion signal generating section 28a has the same configuration as the pre-distortion signal generating section 26, generates the pre-distortion signal from the demodulated signal, supplies the generated pre-distortion signal to the subtractor 28b, and supplies the demodulated signal to the coefficient updating section 28c. The subtractor 28b subtracts the pre-distortion signal which is generated from the demodulated signal and output from the pre-distortion signal generating section 28a from the pre-distortion signal which is generated from the transmission signal and output from the pre-distortion signal generating section 26 to obtain the difference between these signals and supplies the obtained difference to the coefficient updating section 28c. The coefficient updating section 28c calculates the distortion compensation coefficients $h_1$ to $h_n$ using the equations (1), which are the same as those in the first embodiment, and supplies the calculated distortion compensation coefficients $h_1$ to $h_n$ respectively to the pre-distortion signal generating sections 26 and 28a as new distortion compensation coefficients.

Next, the delay control section 50 will be described. The amplitude converting section 40 in the delay control section 50 obtains the value of the amplitude $[(I^2+Q^2)^{1/2}]$ of the transmission signal supplied from the terminal 21 and supplies the obtained amplitude value to the amplitude judging section 41 and an inclination calculating section 51. The amplitude judging section 41 judges whether the amplitude value is less than the given value $\beta$ and is more than the given value $\alpha$ ($<\beta$). In the example, the given value $\beta$ is sufficiently smaller than, for example, the value of the maximum amplitude of the transmission signal, such as, for example, about ⅘ the maximum amplitude of the transmission signal. The amplitude judging section 41 generates and supplies the switch-on signal to the switch 42 when the amplitude value is less than the given value $\beta$ and more than the given value $\alpha$. The reason why the switch is set to be turned on where the transmission signal part of the amplitude is less than the given value $\beta$ lies in that the amplitude of the pre-distortion signal changes where the transmission signal part of the amplitude is less than the given value $\beta$, influenced by the lag in timing between the transmission signal in the voltage control amplifier 25 and the pre-distortion signal.

The inclination calculating section 51 judges whether an inclination where the amplitude of the transmission signal is increased is positive (+) or an inclination where the amplitude of the transmission signal is decreased is negative (−), and supplies a result of the judgment to average amplitude sections 52 and 53.

The pre-distortion signal is supplied to the switch 42 from the pre-distortion signal generating section 26 and the switch 42 is turned on when the switch-on signal is supplied from the amplitude judging section 41. The switch 42 is turned on to supply the pre-distortion signal to the average amplitude sections 52 and 53.

The average amplitude section 52 obtains amplitudes of a pre-distortion signal obtained when the switch 42 is turned on when the inclination is positive and also obtains the average amplitude value. The average amplitude section 53 obtains amplitudes of a pre-distortion signal obtained when the switch 42 is turned on when the inclination is negative and also obtains the average amplitude value. The average amplitude values obtained respectively using the average amplitude sections 52 and 53 are supplied to a comparing section 54.

When the protrusions c1 to c5 illustrated in FIG. 5A are generated in the waveform of the pre-distortion signal on parts where the inclinations of the amplitudes of the output signal illustrated in FIG. 4B are positive and hence the average amplitude value of the amplitudes of the positively inclined parts of the pre-distortion signal is increased, the delay time of the delay section 31 may be changed in a direction in which the average amplitude value is decreased.

On the other hand, when protrusions d1 to d5 illustrated in FIG. 5B are generated in the waveform of the pre-distortion signal on parts where the inclinations of the amplitudes of the output signal illustrated in FIG. 4C are negative and hence the average amplitude value of the amplitudes of the negatively inclined parts of the pre-distortion signal is increased, the delay time of the delay section 31 may be changed in a direction in which the average amplitude value is increased.

The comparing section 54 selects the polarity (positive for the average amplitude section 52 or negative for the average amplitude section 53) of the inclination of the average amplitude value which is larger than the other in the average amplitude values of the pre-distortion signals obtained respectively using the average amplitude sections 52 and 53 and supplies the selected polarity to a control section 55.

When the polarity of the inclination is positive, the control section 55 shortens the delay time of the delay section 31 by the short time Δt. On the other hand, when the polarity of the inclination is negative, the control section 55 prolongs the delay time of the delay section 31 by the short time Δt. As an alternative, the control section 55 may be configured to variably adjust the delay time of the delay section 24 in place of the delay section 31.

The distortion compensation coefficients with which the average amplitude value is minimized may be generated by repetitively executing the delay adjusting process using the control section 55. Accordingly, the lag in timing between the voltage signal and the transmission signal in the voltage control amplifier may be reduced regardless of temperature change and aged deterioration of the electronic components making up the power amplifying device. In the second embodiment, since a direction in which the delay time is adjusted is found from the polarity of the inclination, the adjustment time may be reduced.

Third Embodiment

Figure 8:
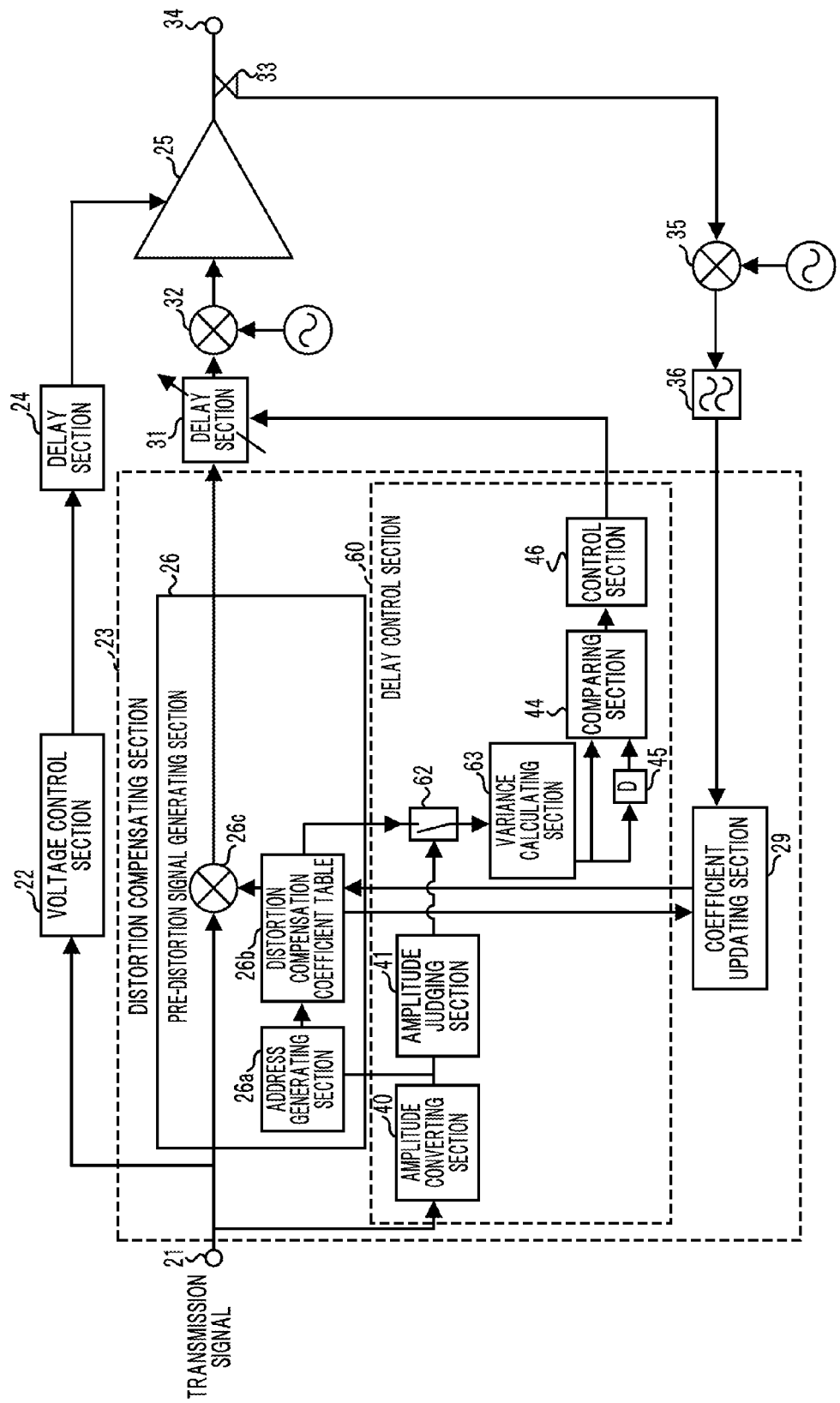
FIG. 8 is a diagram illustrating a configuration of a third embodiment of the power amplifying device.

FIG. 8 is a diagram illustrating a configuration of a third embodiment of the power amplifying device. In FIG. 8, the same numerals are assigned to the same parts as those in FIG. 2.

In FIG. 8, the transmission signal (I, Q) is supplied to the terminal 21. The transmission signal is supplied to the voltage control section 22 and the distortion compensating section 23. The voltage control section 22 obtains the amplitude $[(I^2+Q^2)^{1/2}]$ of the transmission signal (I, Q) and substitutes the obtained amplitude into the function F to generate the voltage signal which is based on the amplitude. In the example illustrated in FIG. 8, the function F is the function with which the voltage signal is set to the constant value when the amplitude value is less than, for example, the given value α, and the voltage signal is set to the value proportional to the amplitude value when the amplitude value is more than the given value α (α corresponds to, for example, fractions of the maximum amplitude of the transmission signal). The voltage signal is supplied to the power source terminal of the voltage control amplifier 25 via the delay section 24.

The distortion compensating section 23 includes the pre-distortion signal generating section 26, a delay control section 60, and the coefficient updating section 29.

The pre-distortion signal generating section 26 may be based on a look-up table system and includes an address generating section 26a, a distortion compensation coefficient table (a memory) 26b, and a multiplier 26c. The amplitude of the transmission signal is supplied from the amplitude converting section 40 in the delay control section 60 to the address generating section 26a and the address generating section 26a generates the address of the distortion compensation coefficient table 26b from the amplitude of the transmission signal supplied thereto and from the increment of the amplitude of the transmission signal. The distortion compensation coefficient table 26b is accessed using the address generated by the address generating section 26a, and a distortion compensation coefficient is read out from the distortion compensation coefficient table 26b.

The multiplier 26c complex-multiples the transmission signal x(t) supplied from the terminal 21 and a distortion compensation coefficient h(m) read out from the distortion compensation coefficient table 26b to generate a pre-distortion signal y(t) having the reverse characteristic of the distortion characteristic of the voltage control amplifier 25. m is a value determined from the amplitude of the transmission signal x(t).

$$y(t)=h(m)\times x(t) \tag{2}$$

Also in the above mentioned first embodiment, if the pre-distortion signal generating section 26 is based on a look-up table system, the amplitude converting section 40 may be configured to be commonly used by the pre-distortion signal generating section 26 and the delay control section 60 by supplying the amplitude of the transmission signal from the amplitude converting section 40 to the pre-distortion signal generating section 26 as in the case in the third embodiment.

The pre-distortion signal is supplied to the orthogonal modulator 32 via the delay section 31 to be orthogonally modulated. The orthogonally modulated signal of the radio frequency output from the orthogonal modulator 32 is supplied to the input terminal of the voltage control amplifier 25.

The voltage control amplifier 25 changes the amplification characteristic of the orthogonally modulated signal in accordance with the voltage signal supplied to the power source terminal to perform power amplification on the orthogonally modulated signal. The output signal from the voltage control amplifier 25 is output from the terminal 34 via the directional coupler 33. Part of the orthogonally modulated signal is taken out of the directional coupler 33 and is orthogonally demodulated using the orthogonal demodulator 35. The obtained demodulated signal (I, Q) is supplied to the pre-distortion signal generating section 29 via the filter 36.

The coefficient updating section 29 obtains an updated portion of the distortion compensation coefficient based on the distortion compensation coefficient read out from the pre-distortion signal generating section 26, the difference between the transmission signal and the demodulated signal, and the demodulated signal using the equation (3). The coefficient updating section 29 adds the updated portion to the distortion compensation coefficient read out from the distortion compensation coefficient generating section 45 to generate a new distortion compensation coefficient. The coefficient updating section 29 supplies the new distortion compensation coefficient generated to the pre-distortion signal generating section 26 to update the distortion compensation coefficient in the distortion compensation coefficient table.

Next, the equation of generating the distortion compensation coefficient h(m) will be given. In the equation, x(t) is a transmission signal, m is a value determined from the amplitude of the transmission signal x(t), e(t) is a difference, r(t) is a demodulated signal, μ is a coefficient, h−(m) is a distortion compensation coefficient before updated, and x'(t) is a previous transmission signal.

$$h(m) = h-(m) + \mu e(t) \times x(t) \tag{3}$$
$$= h-(m) + \mu\{h-(m) \times x(t) - h-(m) \times x'(t)\} \times$$
$$x(t)h-(m) \times x'(t)$$
$$= r(t) \ldots$$

Next, the delay control section 60 will be described. The amplitude converting section 40 in the delay control section 60 obtains the value of the amplitude $[(I^2+Q^2)^{1/2}]$ of the transmission signal supplied from the terminal 21 and supplies the obtained amplitude value to the amplitude judging section 41. The amplitude judging section 41 judges whether the amplitude value is less than the given value β and is more than the given value α(<β). In the example, the given value β is sufficiently smaller than, for example, the value of the maximum amplitude of the transmission signal, such as, for example, about ⅘ the maximum amplitude of the transmission signal. The amplitude judging section 41 generates and supplies the switch-on signal to a switch 62 when the amplitude value is less than the given value β and more than the given value α. The reason why the switch is set to be turned on where the transmission signal part of the amplitude is less than the given value β lies in that the amplitude of the pre-distortion signal changes where the transmission signal part of the amplitude is less than the given value β, influenced by the lag in timing between the transmission signal in the voltage control amplifier 25 and the pre-distortion signal.

In the third embodiment, unlike the first and second embodiments, the distortion compensation coefficient read out from the distortion compensation coefficient table 26b of the distortion signal generating section 26 is supplied to the switch 62, and the switch 62 is turned on when the switch-on signal is supplied from the amplitude judging section 41. The switch 62 is turned on to supply the distortion compensation coefficient to a variance calculating section 63.

The variance calculating section 63 obtains the variance (the variance with respect to the distortion compensation coefficients obtained for a given time) of the distortion compensation coefficients obtained when the switch 62 is turned on. The variance value of the distortion compensation coefficients obtained using the variance calculating section 63 is supplied directly to the comparing section 44 and is delayed by the given time D required to update the distortion compensation coefficient by being subjected to feedback control using the delay section 45, and then is supplied to the comparing section 44. The comparing section 44 compares the undelayed variance value of the distortion compensation coefficients with the delayed variance of the distortion compensation coefficients and supplies a result of the comparison to the control section 46. The control section 46 variably adjusts the delay time of the delay section 31 in accordance with the comparison result. The control section 46 may be configured to variably adjust the delay time of the delay section 24 in place of the delay section 31.

As described above, when the distortion compensation coefficient of the distortion signal generating section 26 is updated using the coefficient updating section 29 in a state that the signal which is output from the voltage control amplifier 25 having the amplitude smaller than the desired amplitude is fed back, the distortion compensation coefficients corresponding to the notches are increased so as to compensate for the notches which are reduced in amplitude. Accordingly, the variance value of the distortion compensation coefficients is increased.

Therefore, the timing of the transmission signal input into the voltage control amplifier 25 may be brought into coincidence with the timing of the voltage signal input into the voltage control amplifier 25 by variably adjusting the delay time of the delay section 31 so that the variance value of the distortion compensation coefficients is decreased.

Fourth Embodiment

Figure 9:
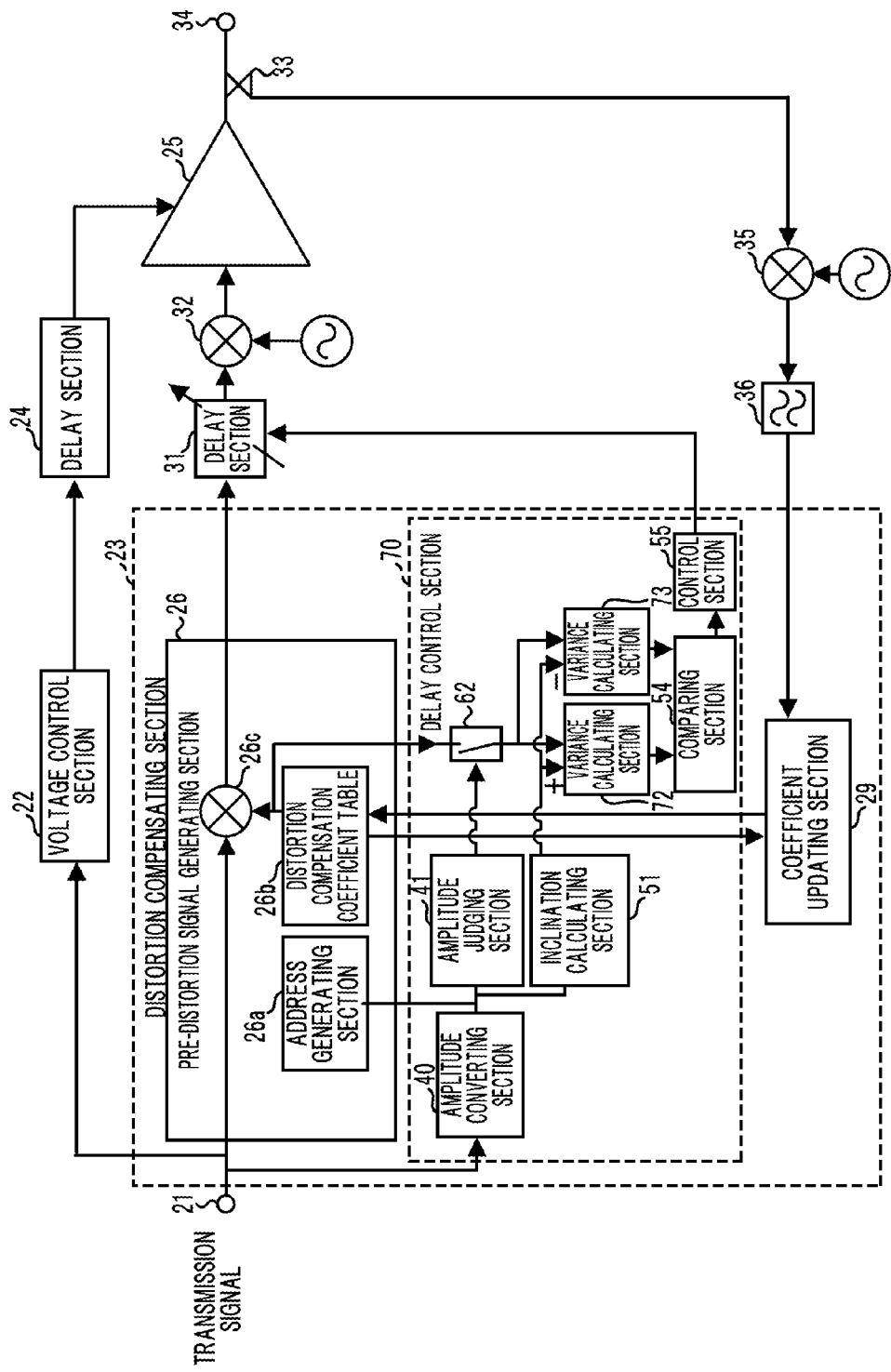
FIG. 9 is a diagram illustrating a configuration of a fourth embodiment of the power amplifying device.

FIG. 9 is a diagram illustrating a configuration of a fourth embodiment of the power amplifying device. In FIG. 9, the same numerals are assigned to the same parts as those in FIG. 7.

In FIG. 9, the transmission signal (I, Q) is supplied to the terminal 21. The transmission signal is supplied to the voltage control section 22 and the distortion compensating section 23. The voltage control section 22 obtains the amplitude $[(I^2+Q^2)^{1/2}]$ of the transmission signal (I, Q) and substitutes the obtained amplitude into the function F to generate the voltage signal which is based on the amplitude. In the example illustrated in the drawing, the function F is the function with which the voltage signal is set to the constant value when the amplitude value is less than, for example, the given value α, and the voltage signal is set to the value proportional to the amplitude value when the amplitude value is more than the given value α (α corresponds to, for example, fractions of the maximum amplitude of the transmission signal). The voltage signal is supplied to the power source terminal of the voltage control amplifier 25 via the delay section 24.

The distortion compensating section 23 includes the pre-distortion signal generating section 26, a delay control section 70, and the coefficient updating section 29.

The pre-distortion signal generating section 26 is based on a look-up table system and includes the address generating section 26a, the distortion compensation coefficient table (the memory) 26b, and the multiplier 26c. The amplitude of the transmission signal is supplied from the amplitude converting section 40 in the delay control section 60 to the address generating section 26a, and then the address generating section 26a generates the address of the distortion compensation coefficient table 26b from the amplitude of the transmission signal supplied thereto and its increment. The distortion compensation coefficient table 26b is accessed using the address generated by the address generating section 26a and the distortion compensation coefficient concerned is read out from the distortion compensation coefficient table 26b.

The multiplier 26c complex-multiples the transmission signal x(t) supplied from the terminal 21 and the distortion compensation coefficient h(m) read out from the distortion compensation coefficient table 26b to generate the distortion signal y(t) having the reverse characteristic of the distortion characteristic of the voltage control amplifier 25 using the equation (2) which is the same as that in the third embodiment.

Also in the above mentioned second embodiment, if the pre-distortion signal generating section 26 is based on a look-up table system, the amplitude converting section 40 may be configured to be commonly used by the pre-distortion signal generating section 26 and the delay control section 70 by supplying the amplitude of the transmission signal from the amplitude converting section 40 to the pre-distortion signal generating section 26 as in the case in the fourth embodiment.

The pre-distortion signal is supplied to the orthogonal modulator 32 via the delay section 31 to be orthogonally modulated. The orthogonally modulated signal of the radio frequency output from the orthogonal modulator 32 is supplied to the input terminal of the voltage control amplifier 25. The voltage control amplifier 25 changes the amplification characteristic of the orthogonally modulated signal in accordance with the voltage signal supplied to the power source terminal to perform power amplification on the orthogonally modulated signal. The output signal from the voltage control amplifier 25 is output from the terminal 34 via the directional coupler 33. Part of the orthogonally modulated signal is taken out of the directional coupler 33 and is orthogonally demodulated using the orthogonal demodulator 35. The obtained demodulated signal (I, Q) is supplied to the pre-distortion signal generating section 29 via the filter 36.

The coefficient updating section 29 obtains the updated portion of the distortion compensation coefficient based on the distortion compensation coefficient read out from the pre-distortion signal generating section, the difference between the transmission signal and the demodulated signal, and the demodulated signal using the equation (3) which is the same as that in the third embodiment. The coefficient updating section 29 adds the updated portion to the distortion compensation coefficient read out from the distortion compensation coefficient generating section 45 to generate the new distortion compensation coefficient. The coefficient updating section 29 supplies the new distortion compensation coefficient generated to the pre-distortion signal generating section 26 to update the distortion compensation coefficient in the distortion compensation coefficient table.

Next, the delay control section 70 will be described. The amplitude converting section 40 in the delay control section 70 obtains the value of the amplitude $[(I^2+Q^2)^{1/2}]$ of the transmission signal supplied from the terminal 21 and supplies the obtained amplitude value to the amplitude judging section 41 and the inclination calculating section 51. The amplitude judging section 41 judges whether the amplitude value is less than the given value $\beta$ and is more than the given value $\alpha(<\beta)$. In the example, the given value $\beta$ is sufficiently smaller than, for example, the value of the maximum amplitude of the transmission signal, such as, for example, about 4/5 the maximum amplitude of the transmission signal. The amplitude judging section 41 generates and supplies the switch-on signal to the switch 62 when the amplitude value is less than the given value $\beta$ and more than the given value $\alpha$. The reason why the switch is set to be turned on where the transmission signal part of the amplitude value is less than the given value $\beta$ lies in that the amplitude of the pre-distortion signal changes where the transmission signal part of the amplitude is less than the given value $\beta$, influenced by the lag in timing between the transmission signal in the voltage control amplifier 25 and the pre-distortion signal.

The inclination calculating section 51 judges whether the inclination at which the amplitude of the transmission signal is increased is positive (+) or the inclination at which the amplitude of the transmission signal is decreased is negative (−) and supplies a result of the judgment to variance calculating sections 72 and 73.

In the fourth embodiment, like the third embodiment, the distortion compensation coefficient read out from the distortion compensation coefficient table 26b of the distortion signal generating section 26 is supplied to the switch 62 and the switch 62 is turned on when the switch-on signal is being supplied from the amplitude judging section 41. The switch 62 is turned on to supply the distortion compensation coefficient to the variance calculating sections 72 and 73.

When the inclination is positive, the variance calculating section 72 obtains the variance of the distortion compensation coefficients obtained when the switch 62 is turned on. When the inclination is negative, the variance calculating section 73 obtains the variance of the distortion compensation coefficients obtained when the switch 62 is turned on. The variance values of the distortion compensation coefficients obtained using the variance calculating sections 72 and 74 are supplied to the comparing section 54.

When the protrusions c1 to c5 illustrated in FIG. 5A are generated in the waveform of the pre-distortion signal on parts where the inclinations of the amplitudes of the output signal illustrated in FIG. 4B are positive and hence the variance value of the distortion compensation coefficients of the positively inclined parts is increased, the delay time of the delay section 31 may be changed in a direction in which the delay time is decreased.

On the other hand, when the protrusions d1 to d5 illustrated in FIG. 5B are generated in the waveform of the pre-distortion signal on parts where the inclinations of the amplitudes of the output signal illustrated in FIG. 4C are negative and hence the variance value of the distortion compensation coefficients of the negatively inclined parts is increased, the delay time of the delay section 31 may be changed in a direction in which the delay time is increased.

The comparing section 54 selects the polarity (positive for the variance calculating section 72 or negative for the variance calculating section 73) of the inclination of the variance value of the distortion compensation coefficients which is larger in the distortion compensation coefficient variance values obtained respectively using the variance calculating sections 72 and 73 and supplies the selected polarity to the control section 55.

When the polarity of the inclination is positive, the control section 55 shortens the delay time of the delay section 31 by the short time $\Delta t$. On the other hand, when the polarity of the inclination is negative, the control section 55 prolongs the delay time of the delay section 31 by the short time $\Delta t$. As an alternative, the control section 55 may be configured to variably adjust the delay time of the delay section 24 in place of the delay section 31.

The distortion compensation coefficients with which the average amplitude value is minimized may be generated by repetitively executing the delay adjusting process using the control section 55. Accordingly, the lag in timing between the voltage signal and the transmission signal in the voltage control amplifier may be reduced regardless of temperature change and aged deterioration of the electronic components making up the power amplifying device. In the fourth embodiment, since the direction in which the delay time is adjusted is found from the polarity of the inclination, the time for adjustment may be reduced.

Although in the above mentioned embodiment, the pre-distortion signal generating section 26 based on the look-up table system is employed, a pre-distortion signal generating section of a series type distortion compensation system may be used instead.

Fifth Embodiment

Figure 10:
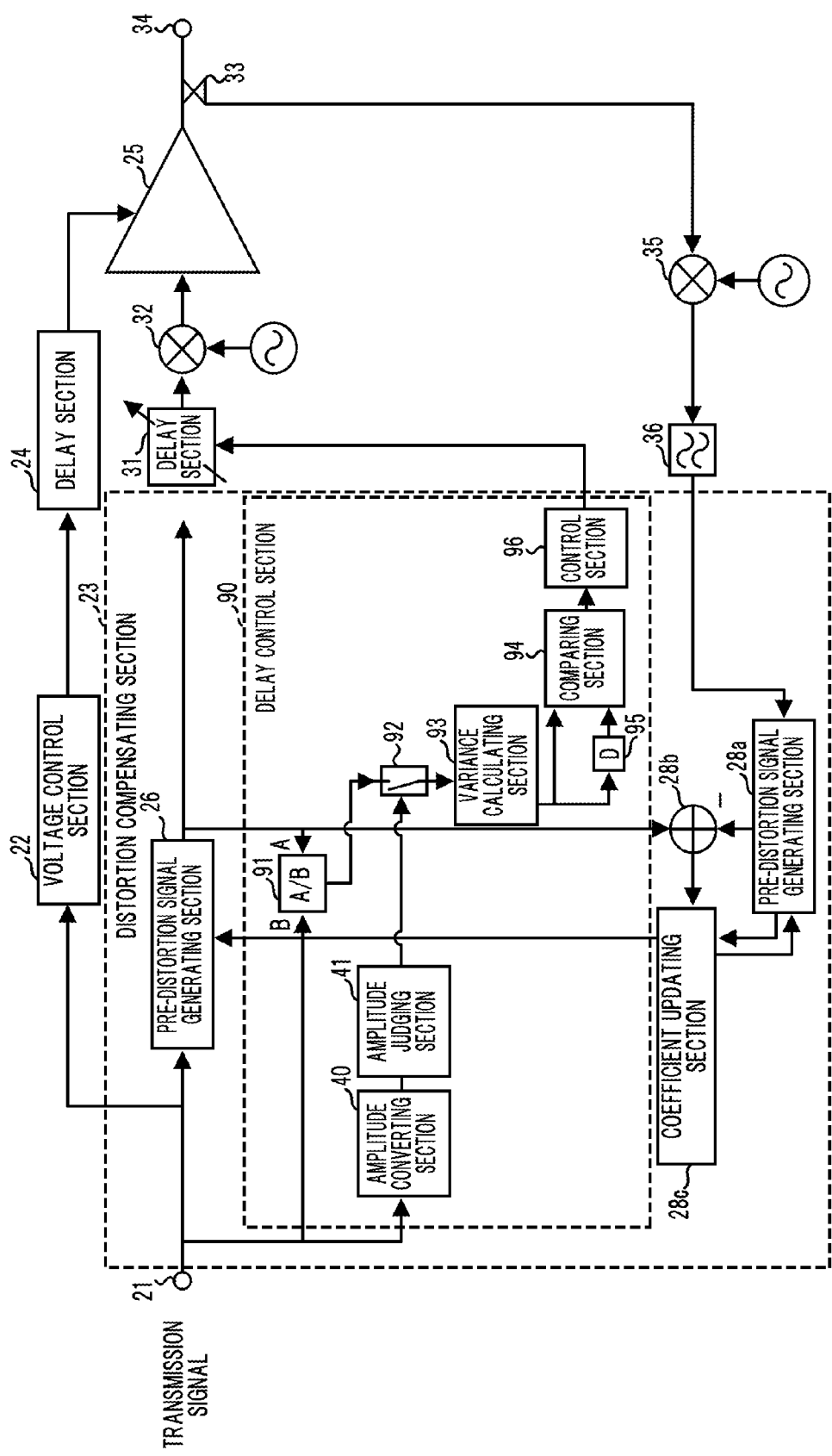
FIG. 10 is a diagram illustrating a configuration of a fifth embodiment of the power amplifying device.

FIG. 10 is a diagram illustrating a configuration of a fifth embodiment of the power amplifying device. In FIG. 10, the same numerals are assigned to the same parts as those in FIG. 2.

In FIG. 10, the transmission signal (I, Q) is supplied to the terminal 21. The transmission signal is then supplied to the voltage control section 22 and the distortion compensating section 23. The voltage control section 22 obtains the amplitude $[(I^2+Q^2)^{1/2}]$ of the transmission signal (I, Q) and substitutes the obtained amplitude into the function F to generate the voltage signal which is based on the amplitude. In the example illustrated in the drawing, the function F is the function with which the voltage signal is set to the constant value when the amplitude value is less than, for example, the given value $\alpha$, and the voltage signal is set to the value proportional to the amplitude value when the amplitude value is more than the given value $\alpha$ ($\alpha$ corresponds to, for example, fractions of the maximum amplitude of the transmission signal). The voltage signal is supplied to the power source terminal of the voltage control amplifier 25 via the delay section 24.

The distortion compensating section 23 includes the pre-distortion signal generating section 26, the delay control section 27, the pre-distortion signal generating section 28a, the subtractor 28b, and the coefficient updating section 28c. The pre-distortion signal generating section 26 generates a pre-distortion signal, for example, by a series type distortion compensation system. As the pre-distortion signal generating section, 26, a pre-distortion signal generating section based on a look-up table system may be used instead.

The pre-distortion signal is supplied to the orthogonal modulator 32 via the delay section 31 to be orthogonally modulated. The orthogonally modulated signal of the radio frequency output from the orthogonal modulator 32 is supplied to the input terminal of the voltage control amplifier 25.

The voltage control amplifier 25 changes the amplification characteristic of the orthogonally modulated signal in accordance with the voltage signal supplied to the power source terminal to perform power amplification on the orthogonally modulated signal. The output signal from the voltage control amplifier 25 is output from the terminal 34 via the directional coupler 33. Part of the orthogonally modulated signal is taken out of the directional coupler 33 and is orthogonally demodulated using the orthogonal demodulator 35. The obtained demodulated signal (I, Q) is supplied to the pre-distortion signal generating section 28a via the filter 36.

The pre-distortion signal generating section 28a has the same configuration as the pre-distortion signal generating section 26, generates the pre-distortion signal from the demodulated signal, supplies the generated pre-distortion signal to the subtractor 28b, and supplies the demodulated signal to the coefficient updating section 28c. The subtractor 28b subtracts the pre-distortion signal which is generated from the demodulated signal and output from the pre-distortion signal generating section 28a from the pre-distortion signal which is generated from the transmission signal and output from the pre-distortion signal generating section 26 to obtain the difference between the signals, and supplies the obtained difference to the coefficient updating section 28c. The coefficient updating section 28c calculates the distortion compensation coefficients $h_1$ to $h_n$ using the equations (1), which are the same as the equations in the first embodiment, and supplies the calculated distortion compensation coefficients $h_1$ to $h_n$ respectively to the pre-distortion signal generating sections 26 and 28a as new distortion compensation coefficients.

A delay control section 90 will be described. A dividing circuit 91 in the delay control section 90 divides a pre-distortion signal A supplied from the pre-distortion signal generating section 26 by a transmission signal B supplied from the terminal 21 (A/B). A value (A/B) corresponding to the distortion compensation coefficient for the transmission signal is obtained by executing the above arithmetic operation and the distortion compensation coefficient corresponding value is supplied to a switch 92.

The amplitude converting section 40 obtains the value of the amplitude $[(I^2+Q^2)^{1/2}]$ of the transmission signal supplied from the terminal 21 and supplies the obtained amplitude value to the amplitude judging section 41. The amplitude judging section 41 judges whether the amplitude value is less than the given value β and is more than the given value α(<β). In the example, the given value β is sufficiently smaller than, for example, the value of the maximum amplitude of the transmission signal, such as, for example, about ⅘ the maximum amplitude of the transmission signal. The amplitude judging section 41 generates and supplies the switch-on signal to a switch 92 when the amplitude value is less than the given value β and more than the given value α. The reason why the switch is set to be turned on where the transmission signal part of the amplitude is less than the given value β lies in that the amplitude of the pre-distortion signal changes where the transmission signal part of the amplitude is less than the given value β, influenced by the lag in timing between the transmission signal in the voltage control amplifier 25 and the pre-distortion signal.

The distortion compensation coefficient corresponding value is supplied to the switch 92 and the switch 92 is turned on when the switch-on signal is supplied from the amplitude judging section 41. The switch 92 is turned on to supply the distortion compensation coefficient corresponding value to a variance calculating section 93.

The variance calculating section 93 obtains the variance (the variance with respect to the distortion compensation coefficients obtained for a given time) of the distortion compensation coefficient corresponding values obtained when the switch 62 is turned on. The variance value of the distortion compensation coefficients obtained using the variance calculating section 93 is supplied directly to a comparing section 94 and is delayed by the given time D required to update the distortion compensation coefficient by being subjected to feedback control using a delay section 95 and is then supplied to the comparing section 94. The comparing section 94 compares the undelayed variance value of the distortion compensation coefficients with the delayed variance of the distortion compensation coefficients and supplies a result of comparison to a control section 96. The control section 96 variably adjusts the delay time of the delay section 31 in accordance with the comparison result. The control section 96 may be configured to variably adjust the delay time of the delay section 24 in place of the delay section 31.

As described above, when the distortion compensation coefficient of the distortion signal generating section 26 is updated using the coefficient updating section 28c in a state that the signal which is output from the voltage control amplifier 25 having the amplitude smaller than the desired amplitude is fed back, the distortion compensation coefficients corresponding to the notches are increased so as to compensate for the notches which are reduced in amplitude. Accordingly, the variance value of the distortion compensation coefficient corresponding values is also increased.

Therefore, the timing of the transmission signal input into the voltage control amplifier 25 may be brought into coincidence with the timing of the voltage signal input into the voltage control amplifier 25 by variably adjusting the delay time of the delay section 31 such that the variance value of the distortion compensation coefficient corresponding values is decreased.

Sixth Embodiment

Figure 11:
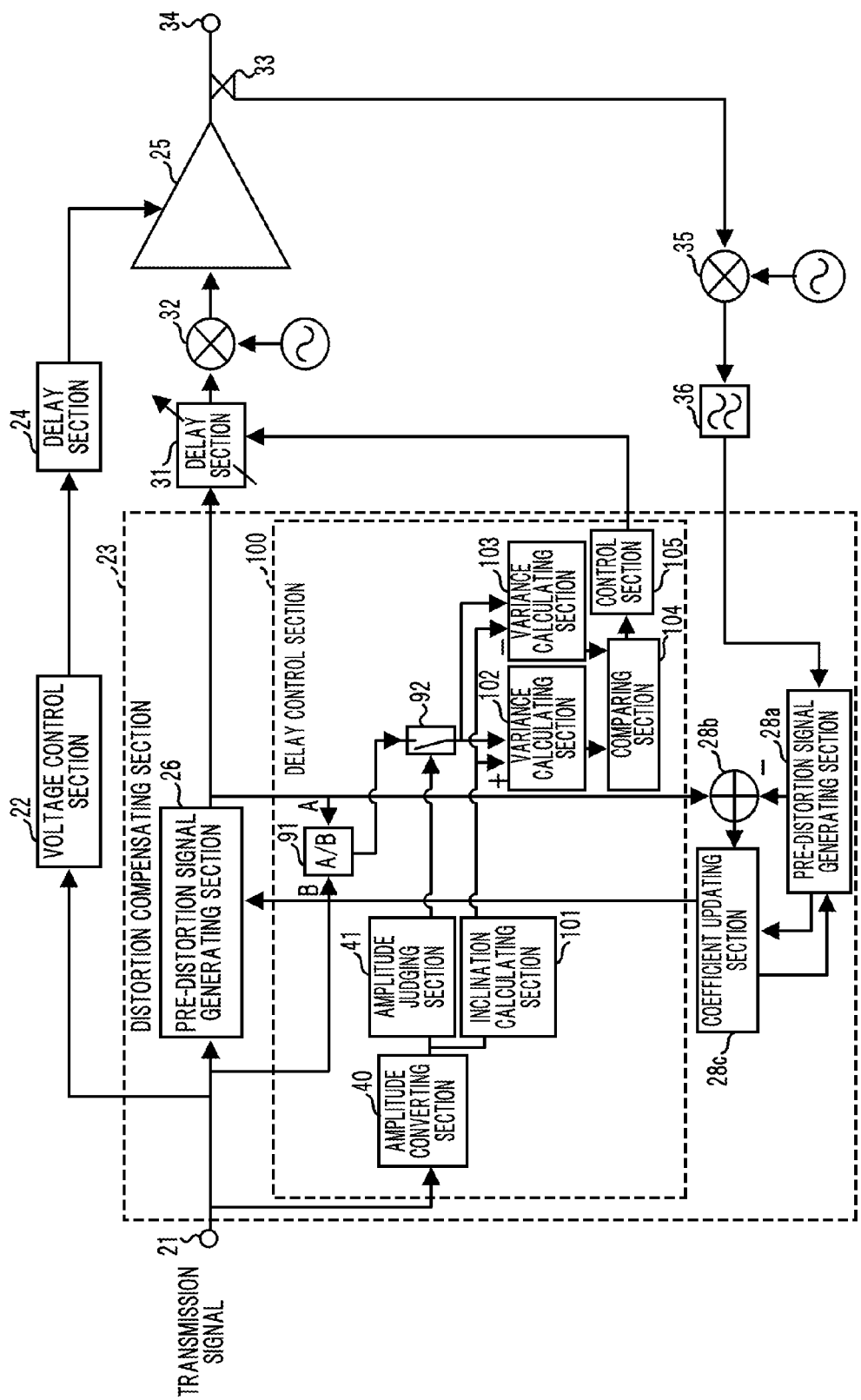
FIG. 11 is a diagram illustrating a configuration of a sixth embodiment of the power amplifying device.

FIG. 11 is a diagram illustrating a configuration of a sixth embodiment of the power amplifying device. In FIG. 10, the same numerals are assigned to the same parts as those in FIG. 2.

In FIG. 11, the transmission signal (I, Q) is supplied to the terminal 21. The transmission signal is then supplied to the voltage control section 22 and the distortion compensating section 23. The voltage control section 22 obtains the amplitude $[(I^2+Q^2)^{1/2}]$ of the transmission signal (I, Q) and substitutes the obtained amplitude into the function F to generate the voltage signal which is based on the amplitude. In the example illustrated in the drawing, the function F is the function with which the voltage signal is set to a constant value when the amplitude value is less than, for example, the given value α, and the voltage signal is set to the value proportional to the amplitude value when the amplitude value is more than the given value α (α corresponds to, for example, fractions of the maximum amplitude of the transmission signal). The voltage signal is supplied to the power source terminal of the voltage control amplifier 25 via the delay section 24.

The distortion compensating section 23 includes the pre-distortion signal generating section 26, the delay control section 27, the pre-distortion signal generating section 28a, the subtractor 28b, and the coefficient updating section 28c. The pre-distortion signal generating section 26 generates a pre-distortion signal, for example, by a series type distortion compensation system. As the pre-distortion signal generating section, 26, a pre-distortion signal generating section of a look-up table system may be also used.

The pre-distortion signal is supplied to the orthogonal modulator 32 via the delay section 31 to be orthogonally modulated. The orthogonally modulated signal of the radio frequency output from the orthogonal modulator 32 is supplied to the input terminal of the voltage control amplifier 25.

The voltage control amplifier 25 changes the amplification characteristic of the orthogonally modulated signal in accordance with the voltage signal supplied to the power source terminal to perform power amplification on the orthogonally modulated signal. The output signal from the voltage control amplifier 25 is output from the terminal 34 via the directional coupler 33. Part of the orthogonally modulated signal is taken out of the directional coupler 33 and is orthogonally demodulated using the orthogonal demodulator 35. The obtained demodulated signal (I, Q) is supplied to the pre-distortion signal generating section 28a via the filter 36.

The pre-distortion signal generating section 28a has substantially the same configuration as the pre-distortion signal generating section 26, generates the pre-distortion signal from the demodulated signal, supplies the generated pre-distortion signal to the subtractor 28b, and supplies the demodulated signal to the coefficient updating section 28c. The subtractor 28b subtracts the pre-distortion signal which is generated from the demodulated signal and output from the pre-distortion signal generating section 28a from the pre-distortion signal which is generated from the transmission signal and output from the pre-distortion signal generating section 26 to obtain the difference between the signals and supplies the obtained difference to the coefficient updating section 28c. The coefficient updating section 28c calculates the distortion compensation coefficients $h_1$ to $h_n$ using the equations (1) which are the same as the equations in the first embodiment, and supplies the calculated distortion compensation coefficients $h_1$ to $h_n$ respectively to the pre-distortion signal generating sections 26 and 28a as new distortion compensation coefficients.

Next, a delay control section 100 will be described. The dividing circuit 91 in the delay control section 100 divides the pre-distortion signal A supplied from the pre-distortion signal generating section 26 by the transmission signal B supplied from the terminal 21 (A/B). The value (A/B) corresponding to the distortion compensation coefficient for the transmission signal is obtained by executing the above arithmetic operation and the distortion compensation coefficient corresponding value is supplied to the switch 92.

The amplitude converting section 40 obtains the value of the amplitude $[(I^2+Q^2)^{1/2}]$ of the transmission signal supplied from the terminal 21 and supplies the obtained amplitude value to the amplitude judging section 41. The amplitude judging section 41 judges whether the amplitude value is less than the given value $\beta$ and is more than the given value $\alpha(<\beta)$. In the example, the given value $\beta$ is sufficiently smaller than, for example, the value of the maximum amplitude of the transmission signal, such as, for example, about ⅘ the maximum amplitude of the transmission signal. The amplitude judging section 41 generates and supplies the switch-on signal to the switch 92 where the amplitude value is less than the given value $\beta$ and more than the given value $\alpha$. The reason why the switch is set to be turned on where the transmission signal part of the amplitude is less than the given value $\beta$ lies in that the amplitude of the pre-distortion signal changes where the transmission signal part of the amplitude is less than the given value $\beta$, influenced by the lag in timing between the transmission signal in the voltage control amplifier 25 and the pre-distortion signal.

An inclination calculating section 101 judges whether the inclination at which the amplitude of the transmission signal is increased is positive (+) or the inclination at which the amplitude of the transmission signal is decreased is negative (−), and supplies a result of the judgment to variance calculating sections 102 and 103.

The distortion compensation coefficient corresponding value is supplied to the switch 92 and the switch 92 is turned on when the switch-on signal is being supplied from the amplitude judging section 41. The switch 92 is turned on to supply the distortion compensation coefficient corresponding value to the variance calculating sections 102 and 103.

The variance calculating section 102 obtains the variance of the distortion compensation coefficient corresponding values obtained when the switch 92 is turned on when the inclination is positive. The variance calculating section 103 obtains the variance of the distortion compensation coefficient corresponding values obtained when the switch 92 is turned on when the inclination is negative. The variance values of the distortion compensation coefficient corresponding values obtained using the variance calculating sections 102 and 103 are supplied to a comparing section 104.

As described above, when the protrusions c1 to c5 illustrated in FIG. 5A are generated in the waveform of the pre-distortion signal on parts where the inclinations of the amplitudes of the output signal illustrated in FIG. 4B are positive and hence the variance value of the distortion compensation coefficient corresponding values of the positively inclined parts is increased, the delay time of the delay section 31 may be changed in a direction in which the delay time is decreased.

On the other hand, when the protrusions d1 to d5 illustrated in FIG. 5B are generated in the waveform of the pre-distortion signal on parts where the inclinations of the amplitudes of the output signal illustrated in FIG. 4C are negative and hence the variance value of the distortion compensation coefficient corresponding values of the negatively inclined parts is increased, the delay time of the delay section 31 may be changed in a direction in which the delay time is increased.

The comparing section 104 selects the polarity (positive for the variance calculating section 102 or negative for the variance calculating section 103) of the inclination of the variance value of the distortion compensation coefficient corresponding values which is larger in the variance values of the distortion compensation coefficient corresponding values obtained respectively using the variance calculating sections 102 and 103 and supplies the selected polarity to a control section 105.

When the polarity of the inclination is positive, the control section 105 shortens the delay time of the delay section 31 by the short time Δt. On the other hand, when the polarity of the inclination is negative, the control section 105 prolongs the delay time of the delay section 31 by the short time Δt. As an alternative, the control section 105 may be configured to variably adjust the delay time of the delay section 24 in place of the delay section 31.

The distortion compensation coefficients with which the average amplitude value is minimized may be generated by repetitively executing the delay adjusting process using the control section 105. Accordingly, the lag in timing between the voltage signal and the transmission signal in the voltage control amplifier may be reduced regardless of temperature change and aged deterioration of the electronic components making up the power amplifying device. In the sixth embodiment, since the direction in which the delay time is adjusted is found from the polarity of the inclination, the time for adjustment may be reduced.

Although in the sixth mentioned embodiment, the pre-distortion signal generating section 26 of the series type distortion compensation system is employed, a pre-distortion signal generating section based on a look-up table system may be used instead.

According to the above mentioned first to sixth embodiments, the lag in timing between the voltage signal and the transmission signal supplied to the voltage control amplifier may be reduced.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power amplifying device comprising:
    an amplifier that amplifies a signal which is input in accordance with a voltage signal which is supplied to the amplifier;
    a voltage control section that controls the voltage signal in accordance with a transmission signal;
    a distortion compensating section that executes a distortion compensating process on the transmission signal by giving a value indicative of a reverse characteristic of an input-to-output characteristic of the amplifier to the transmission signal in advance and inputs an output signal obtained by executing the distortion compensating process into the amplifier;
    an amplitude detecting section that detects an amplitude of the transmission signal;
    a timing adjusting section that adjusts timings of the output signal and the voltage signal so that a value relating to the distortion compensating process executed on the transmission signal meets a given condition when a detected value of the amplitude of the transmission signal is less than a given value, said given value being less than a value of a maximum amplitude of the transmission signal; and
    a coefficient updating section that sequentially updates a distortion compensation coefficient according to the reverse characteristic of the input-to-output characteristic of the amplifier based on the output signal and a feedback signal of an output from the amplifier;
    wherein the distortion compensating section performs an arithmetic operation in advance using the distortion compensation coefficient on the transmission signal as the distortion compensating process, and
    wherein the timing adjusting section adjusts the timings so as to decrease variance of the distortion compensation coefficient for the transmission signal when the detected value of the amplitude of the transmission signal is less than the given value, and the timing adjusting section calculates the variance of the distortion compensation coefficient using a value obtained by dividing the output signal by the transmission signal as a value corresponding to the distortion compensation coefficient for the transmission signal.

2. The power amplifying device according to claim 1, wherein
    the timing adjusting section adjusts the timings so as to reduce the amplitude of the output signal when the detected value of the amplitude of the transmission signal is less than the given value.

3. The power amplifying device according to claim 1, further comprising:
    an inclination detecting section that detects inclination information of the transmission signal, wherein
    the timing adjusting section determines a direction in which the timings are adjusted in accordance with the inclination information.

4. The power amplifying device according to claim 1, further comprising:
    an inclination detecting section that detects inclination information of the transmission signal, wherein
    the timing adjusting section determines a direction in which the timings are adjusted in accordance with the inclination information of the transmission signal obtained when the detected value of the amplitude of the transmission signal is less than the given value and the variance of the distortion compensation coefficient is increased.

5. A power amplifying method comprising:
    controlling a voltage signal which is supplied to an amplifier in accordance with a transmission signal;
    executing a distortion compensating process on the transmission signal by giving, in advance, a value indicative of a reverse characteristic of an input-to-output characteristic of the amplifier to the transmission signal;
    inputting, into the amplifier, an output signal obtained by executing the distortion compensating process and amplifying the output signal using the amplifier;
    detecting an amplitude of the transmission signal;
    adjusting timings of the output signal and the voltage signal so that a value relating to the distortion compensating process executed on the transmission signal meets a given condition when a detected value of the amplitude of the transmission signal is less than a given value, said given value being less than a value of a maximum amplitude of the transmission signal; and
    sequentially updating a distortion compensation coefficient according to the reverse characteristic of the input-to-output characteristic of the amplifier based on the output signal and a feedback signal of an output from the amplifier;
    wherein the executing includes performing an arithmetic operation in advance using the distortion compensation coefficient on the transmission signal, and
    wherein the adjusting includes:
        adjusting the timings so as to decrease variance of the distortion compensation coefficient for the transmission signal when the detected value of the amplitude of the transmission signal is less than the given value, and
        calculating the variance of the distortion compensation coefficient using a value obtained by dividing the output signal by the transmission signal as a value corresponding to the distortion compensation coefficient for the transmission signal.

6. The power amplifying method according to claim 5, wherein
    the adjusting includes adjusting the timings so as to reduce the amplitude of the output signal when the detected value of the amplitude of the transmission signal is less than the given value.

7. The power amplifying method according to claim 5, further comprising:
- detecting inclination information of the transmission signal, wherein
- the adjusting includes determining a direction in which the timings are adjusted in accordance with the inclination information.

8. The power amplifying method according to claim 5 further comprising:
- detecting inclination information of the transmission signal, wherein
- the adjusting includes determining a direction in which the timings are adjusted in accordance with the inclination information of the transmission signal when the detected value of the amplitude of the transmission signal is less than the given value and the variance of the distortion compensation coefficient is increased.

* * * * *